US006452399B1

United States Patent
Werner, Jr.

(10) Patent No.: US 6,452,399 B1
(45) Date of Patent: Sep. 17, 2002

(54) MODULATOR BASE FOR ELECTROSTATIC VOLTMETER MODULATOR ASSEMBLY

(75) Inventor: Alan J. Werner, Jr., Rochester, NY (US)

(73) Assignee: Xerox Corporation, Rochester, NY (US)

( * ) Notice: Subject to any disclaimer, the term of this patent is extended or adjusted under 35 U.S.C. 154(b) by 0 days.

(21) Appl. No.: 09/770,242

(22) Filed: Jan. 29, 2001

(51) Int. Cl.$^7$ .................. G01R 29/12; G03G 15/00
(52) U.S. Cl. ............................ 324/458; 399/73
(58) Field of Search ........................ 324/458, 457, 324/455, 96; 399/310, 311, 73

(56) References Cited

U.S. PATENT DOCUMENTS 5,212,451 A * 5/1993 Kricka .................. 324/458
5,489,850 A 2/1996 Werner

* cited by examiner

Primary Examiner—N. Le
Assistant Examiner—James Kerveros
(74) Attorney, Agent, or Firm—Oliff & Berridge, PLC

(57) ABSTRACT

An improved modulator assembly of an electrostatic voltmeter for an electrophotographic process. A modulator base of the modulator assembly having accurate configuration and built in design features which simplify manufacture and assembly of the modulator assembly and electrostatic voltmeter. The modulator base includes reference mounting surfaces which provide accurate orientation and alignment of the modulator assembly during assembly, air purge grooves which provide enhanced air purging of contaminants from the modulator assembly, and shielding areas which maximize the signal to noise. The modulator base provides simplified construction of a modulator assembly for an electrostatic voltmeter having enhanced performance and robust functionality.

11 Claims, 16 Drawing Sheets

MODULATOR BASE FOR ELECTROSTATIC VOLTMETER MODULATOR ASSEMBLY

BACKGROUND OF THE INVENTION

The present invention relates to a modulator base of a modulator assembly for electrostatic voltmeters for use in electrophotographic processes. More particularly, the invention is directed to a modulator base having a defined configuration for construction of an improved modulator assembly and electrostatic voltmeter.

In an electrostatic imaging process, six stages are utilized to produce an archival quality image on a copy sheet, such as a page of plain paper. These steps are practiced upon and around a photoreceptor element (P/R), such as a photoreceptor belt or drum, hereinafter simply "photoreceptor." The imaging stages comprise: (1) photoreceptor charging, (2) image formation or exposure, (3) image development, (4) image transfer from the photoreceptor to a copy sheet, (5) fixing of the image on the copy sheet, and (6) restoring the photoreceptor. The process proceeds in a continuous loop and, if a color image is desired, steps (1), (2) and (3) are repeated in sequential stations around the photoreceptor for toner particles of black, magenta, yellow and cyan prior to completing steps (4) through (6) of image transfer, image fixing and restoring the photoreceptor surface to a clean and neutral state.

The second and third process steps of latent image formation on the photoreceptor and image development by applying a desired quantity of toner at a precise location on the photoreceptor latent image require accurate control of an electrostatic charge on the photoreceptor. This can be accomplished by electrostatic charge monitoring and a feedback loop. In particular, in a high speed image development process the toner particles are highly charged and coulomb forces are used to attach charged toner particles to a latent image on the photoreceptor. The magnitude and location of toner deposit is critical to a successful high speed electrophotographic process. Accordingly, accurate monitoring and modulation of an electrostatic field around the photoreceptor is essential. Electrostatic voltmeters, such as application specific integrated circuit electrostatic voltmeters, measure electrostatic fields or potential without current flow through the meter.

A typical electrostatic voltmeter includes a modulator assembly having a sensor electrode or probe and a modulator for modulating the electrostatic field that is being measured in relation to the sensor. The modulator assembly is the sensing element of the electrostatic voltmeter. Electrostatic voltmeters of this type are disclosed in U.S. Pat. No. 5,212,451 to Werner, issued May 18, 1993, and U.S. Pat. No. 5,489,850 to Werner et al., issued Feb. 6, 1996, both of which are assigned to the Xerox Corporation and are of common assignment with the subject application. The disclosures of these prior patents are hereby incorporated by reference as though set forth at length.

One approach to modulating an electrostatic field is to provide an electrostatic voltmeter modulator assembly having a vibratory beam with a device for interrupting the electrostatic voltage or simply "chopper." The chopper oscillates when the vibratory beam is induced to vibrate by a magnetic driver, for example, causing the sensor electrode or probe to repeatedly couple and decouple with an external electrostatic field through a sensing aperture or window in the modulator assembly. Such an approach for modulating an electrostatic field is disclosed in the aforementioned prior U.S. Pat. No. 5,212,451 to Werner and in co-pending application Ser. No. 09/770,243 to Werner, titled "SYSTEM FOR PURGING ELECTROSTATIC VOLTMETER MODULATOR ASSEMBLY", filed on the same date as the subject application, and assigned to the Xerox Corporation which is of common assignment with the subject application. The disclosure of the aforementioned co-pending application is hereby incorporated by reference as though set forth at length.

One problem with current electrostatic voltmeter modulator assemblies, in electrophotographic systems, is that reliable and accurate sensing of the electrostatic field requires the modulator and the modulator assembly to be accurately tooled and assembled. Consequently, manufacture and assembly costs of modulator assemblies tend to be high and performance and dependability of the electrostatic voltmeters are subject to variation based upon how well parameters of the modulator assemblies are controlled during manufacture and assembly. Accordingly, it would be desirable to provide a modulator base for an electrostatic voltmeter modulator assembly having a configuration which simplifies assembly, reduces manufacturing costs, and provides improved performance and robust functionality of the electrostatic voltmeter.

The difficulties and limitations suggested in the preceding are not intended to be exhaustive, but rather are among many which demonstrate that prior art electrostatic voltmeter devices will admit to worthwhile improvement.

It is, therefore, a general object of the invention to provide an improved electrostatic voltmeter system, which will obviate or minimize difficulties of the type previously described.

It is another general object of the invention to provide an improved modulator assembly for an electrostatic voltmeter operable for providing a high level of photoreceptor voltage control for an electrophotographic process.

It is a specific object of the invention to provide an improved modulator assembly of an electrostatic voltmeter having a modulator base with accurate configuration to obtain improved operational reliability and performance of the electrostatic voltmeter.

It is another specific object of the invention to provide an improved electrostatic voltmeter modulator assembly having a modulator base which provides simplified assembly of the modulator assembly and electrostatic voltmeter.

It is another specific object of the invention to provide a modulator base for a modulator assembly of an electrostatic voltmeter whereby the modulator assembly is easy to manufacture and exhibits enhanced operational performance and impenetrability to contamination.

It is yet another specific object of the invention to provide an improved modulator base for a modulator assembly of an electrostatic voltmeter, which has an accurate configuration and fabricated with design features that ensure simplified and accurate construction and assembly of the modulator assembly and electrostatic voltmeter.

It is yet another specific object of the invention to provide an improved modulator base for a modulator assembly of an electrostatic voltmeter, which maximizes the possibility that critical mechanical and electronic parameters of the modulator assembly and electrostatic voltmeter will be advantageously controlled during manufacture and assembly.

SUMMARY OF THE INVENTION

To achieve at least some of the foregoing objects, the invention provides an electrostatic voltmeter having a modulator assembly for modulating and sensing an electrical field of an electrophotographic system. The electrostatic voltmeter includes a modulator base of the modulator assembly for mounting the modulator assembly in the electrostatic voltmeter. A vibratory beam is disposed in the base for modulating an electrical field by oscillating when a vibratory magnetic force is applied at one end of the beam. A sensor electrode is positioned at the other end of the beam for sensing an electrical field modulated by the vibratory beam. At least one reference mounting surface is provided on the modulator base for orienting and aligning the modulator assembly with respect to an electrical field of the electrophotographic system. The at least one reference mounting surface includes a first projection at one end of the modulator base for abutting against a mounting frame of the electrophotographic system so that an opposite end of the modulator base is located at a predetermined position with respect to the electrical field.

A chopper is provided at one end of the beam and the chopper and sensor electrode are situated at the end of the modulator base which is located at a predetermined position with respect to the electrical field. A second projection and a third projection at the one end of the modulator base abut against a base of the electrostatic voltmeter for positioning the modulator assembly in the electrostatic voltmeter. At least one air purge groove is positioned at a front end of the modulator base and, in a preferred embodiment of the present invention, comprises a pair of parallel grooves. A magnetic drive is provided in the modulator base for applying a magnetic force to one end of the vibratory beam. The magnetic drive has a magnet and a pair of beam mounting surfaces are provided in the modulator base for positioning the beam at a predetermined orientation with respect to the sensor electrode and the magnet.

Magnet reference surfaces in the modulator base, at opposite sides of the magnetic drive, lie in the same plane. The magnet is positioned in the modulator base such that a top end of the magnet, proximate to the vibratory beam, lies in the same plane as the magnet reference surfaces. At least two shielding areas are provided in the modulator base. A first shielding area is a floating shield for electrically shielding the sensor electrode and a second shielding area is a grounded shield for electrically shielding a magnetic drive area of the modulator base. The first shielding area includes slots adjacent opposite ends of the sensor electrode and the floating shield extends in the slots to electrically shield the sensor electrode. Alignment projections are situated on a bottom surface of the modulator base for aligning and retaining the modulator assembly in the electrostatic voltmeter.

BRIEF DESCRIPTION OF THE DRAWINGS

Other objects and advantages of the present invention will become apparent from the following detailed description of preferred embodiments thereof taken in conjunction with the accompanying drawings wherein.

DESCRIPTION OF ILLUSTRATIVE EMBODIMENTS

Figure 1:
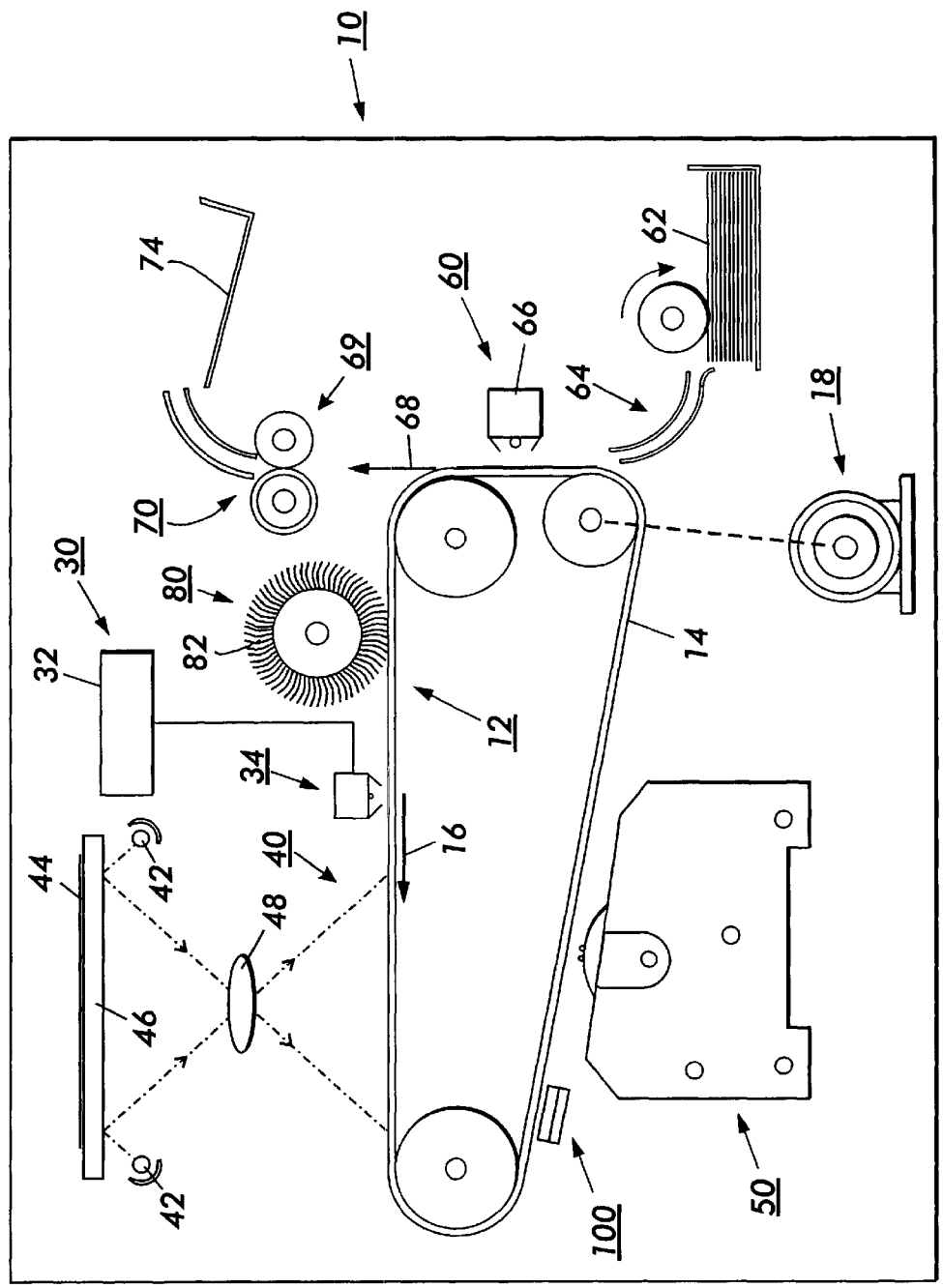
FIG. 1 is a schematic illustration of an exemplary electrophotographic apparatus with a photoreceptor belt and an electrostatic voltmeter in accordance with the present invention.

FIG. 1 discloses a simplified schematic of a one color electrophotographic system 10. In this, a photoreceptor 12 is shown as a continuous belt having a photoconductive exterior surface 14. Although the example in FIG. 1 shows a photoreceptor belt, other embodiments of the photoreceptor 12 may be used, such as a drum having an exterior photoconductive surface. The photoreceptor 12 is driven by a motor 18 in the direction indicated by arrow 16 so that the photoconductive surface 14 passes through various processing stations during a continuous loop imaging process.

A photoreceptor charging station 30 is shown in a position adjacent to the photoconductive surface 14 of the photoreceptor 12. A high voltage electrostatic charge is applied to the photoreceptor 12 by a power supply 32 and a corona generating device 34. An image formation or exposure station 40 is provided downstream of the corona device 34 and is operable to create a latent image on the photoreceptor surface 14. An original document 44 is placed on a transparent platen 46. One or more light sources 42 flash light onto the original document 44, which is reflected through a lens 48 onto the photoreceptor surface 14. Where light is intensely reflected from the original copy field areas, onto the photoreceptor surface 14, the charge on the photoreceptor is dissipated leaving only a charge on the photoreceptor surface 14 corresponding to a latent image of the original document 44. Alternatively, a laser raster output scanner may be used or light emitting diode devices can be used to create an image from an electronic input stream.

An image development station 50 is provided downstream of the image formation station 40 for developing the latent image formed on the photoreceptor surface 14 by depositing charged toner particles on the latent image. An image transfer station 60 is provided for the toner latent image to be transferred from the photoreceptor surface 14 to a plain paper copy sheet 62, which is fed by apparatus 64. The transfer station 60 has a corona generating device 66 for spraying ions onto the back of a sheet of paper to attract the toner image from the photoreceptor surface 14. An image fixing or fusing station 70 is provided and a sheet with a toner image is separated from the photoreceptor 12 and moved by rollers 69 in the direction of the arrow 68 to a fusing station 70 where a fuser assembly (not shown) heats, fuses and permanently affixes a toner image to a copy sheet forming a permanent, archival copy of the original document 44. The completed copy is then deposited in a tray 74. A restoring or cleaning station 80 is provided for cleaning the surface of the photoreceptor 12, with a brush 82, or the like. The cleaning station 80 removes residual toner particles, and a light (not shown) is emitted onto the photoreceptor 12 to dissipate any residual electrostatic charge.

During the photoelectrostatic imaging process, a small test image is laid down on the photoreceptor belt 12 intermittent between full page latent images of original documents so that the electrostatic field on the photoreceptor belt may be monitored and modulated by an electrostatic voltmeter modulator assembly 100 positioned downstream of the image formation station 40 as shown in FIG. 1.

Figure 2:
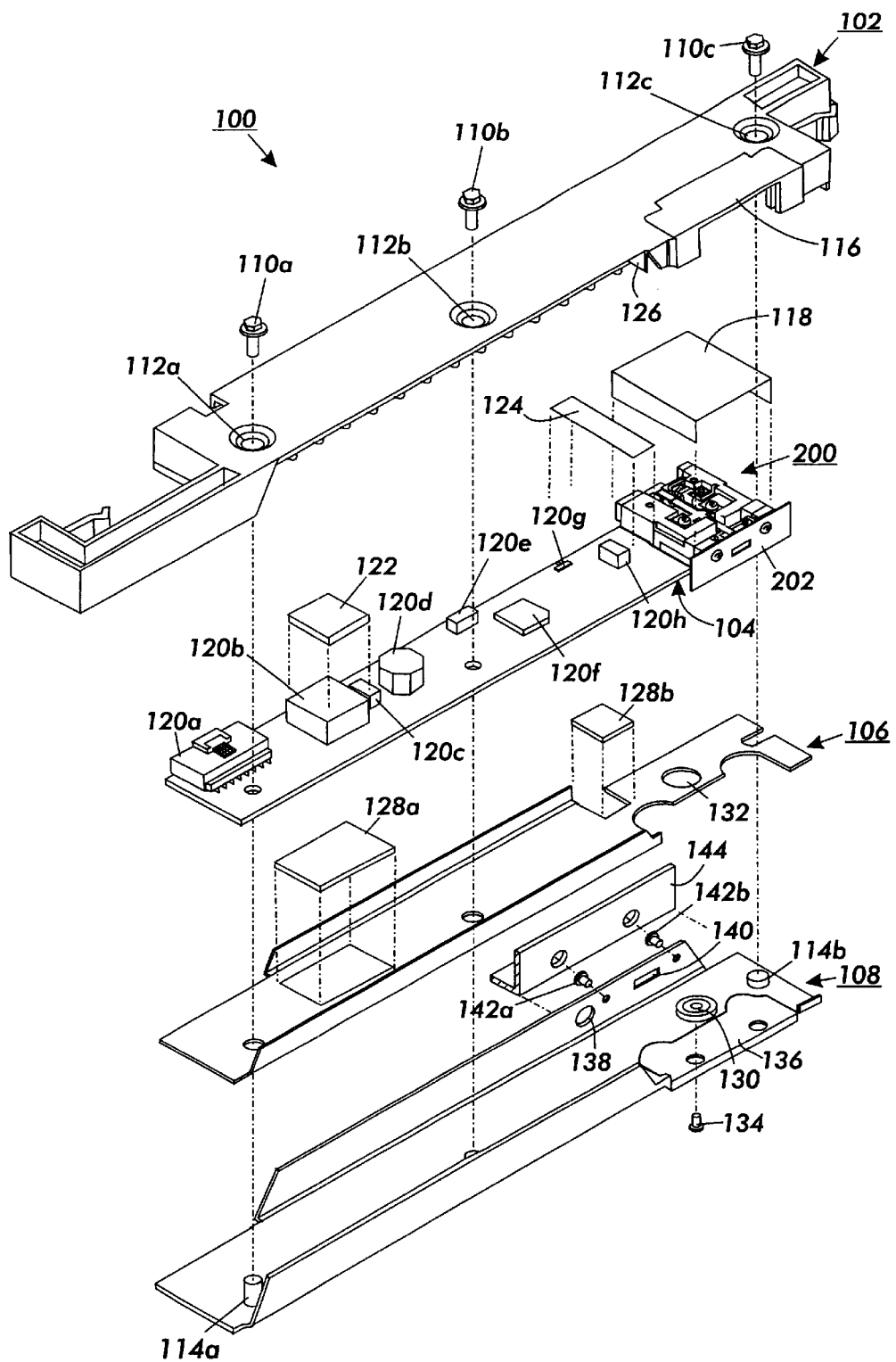
FIG. 2 is an exploded perspective view of an application specific integrated circuit electrostatic voltmeter assembly with a modulator assembly according to a preferred embodiment of the present invention.
Figure 3:
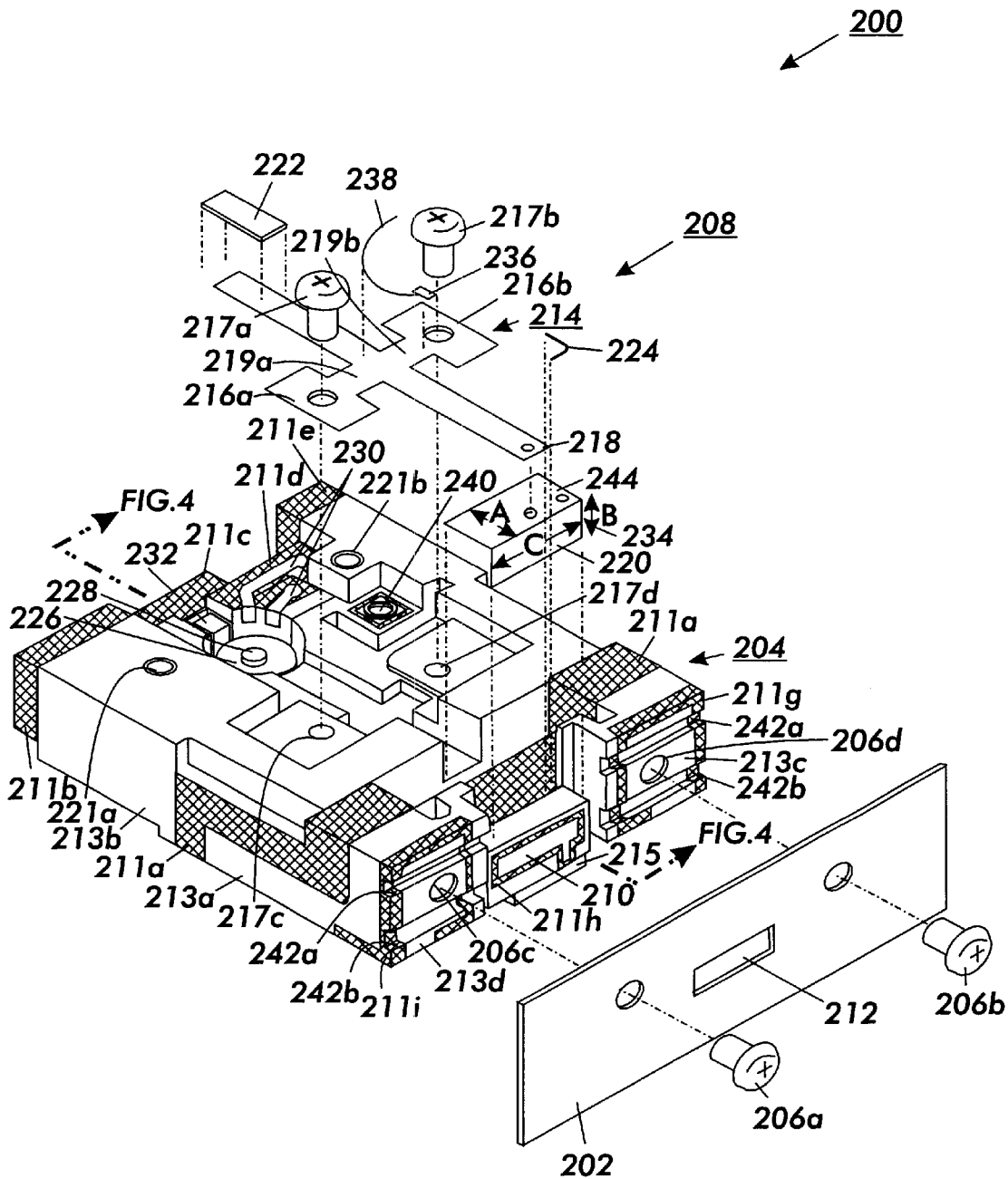
FIG. 3 is an enlarged perspective view of the modulator assembly in FIG. 2 with a single balanced beam vibratory element according to a preferred embodiment of the present invention.

FIGS. 2 and 3 disclose exploded views of an application specific integrated circuit electrostatic voltmeter assembly 100 and a modulator assembly 200 according to a preferred embodiment of the present invention. Referring to FIG. 2, the electrostatic voltmeter assembly 100 includes a cover 102, formed from a suitable material such as a plastic, a printed wire board assembly (hereinafter simply "board assembly") 104, and an insulating layer 106. The insulating layer 106 electrically isolates the board assembly 104 from a base 108, composed of a high strength, rigid material, such as sheet steel. Fasteners 110 (a–c) extend through holes 112 (a–c) in the cover 102 to attach with receptacles 114(a–b) at the base 108 for holding together the various sections of the electrostatic voltmeter assembly 100. The cover 102 has an anti-static member 116, which advantageously is located behind an aperture plate 202 of the modulator assembly 200. See also FIG. 5 which shows the inner surface of the cover 102 with an air purge path indicated by arrows 300 as discussed further below.

As shown in FIG. 2, the modulator assembly 200 is located on the board assembly 104. A paper board insulator 118 covers the top of the modulator assembly 200. Various electronic components 120 (a–h), shown schematically in FIG. 2, are also located on the board assembly 104. One or more heat sinking members 122 are provided if it is necessary or desirable to dissipate heat away from the electronic components 120. An air seal 124, preferably of anti-static plastic foam, is located on the board assembly 104 to seal a gap between the board assembly 104 and an air baffle 126.

Figure 5:
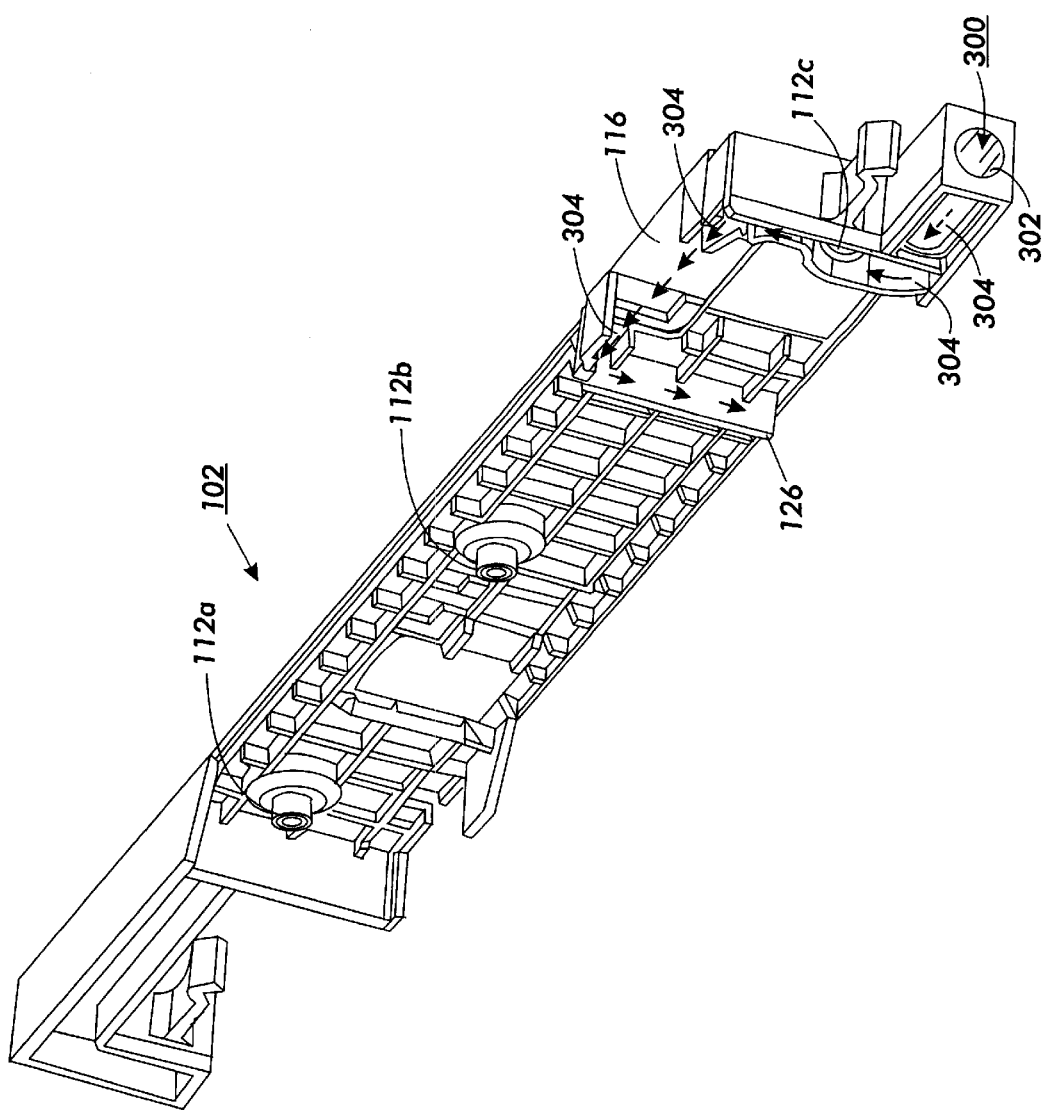
FIG. 5 is a perspective view of the inner surface of a cover of the electrostatic voltmeter assembly of FIG. 2 showing an air purge path.

The air baffle 126 projects downwardly from an inner surface of the cover 102 (note FIG. 5). See also FIG. 11, discussed below, showing the bottom of the board assembly 104 with the modulator assembly 200 and the front plate 202.

Figure 12:
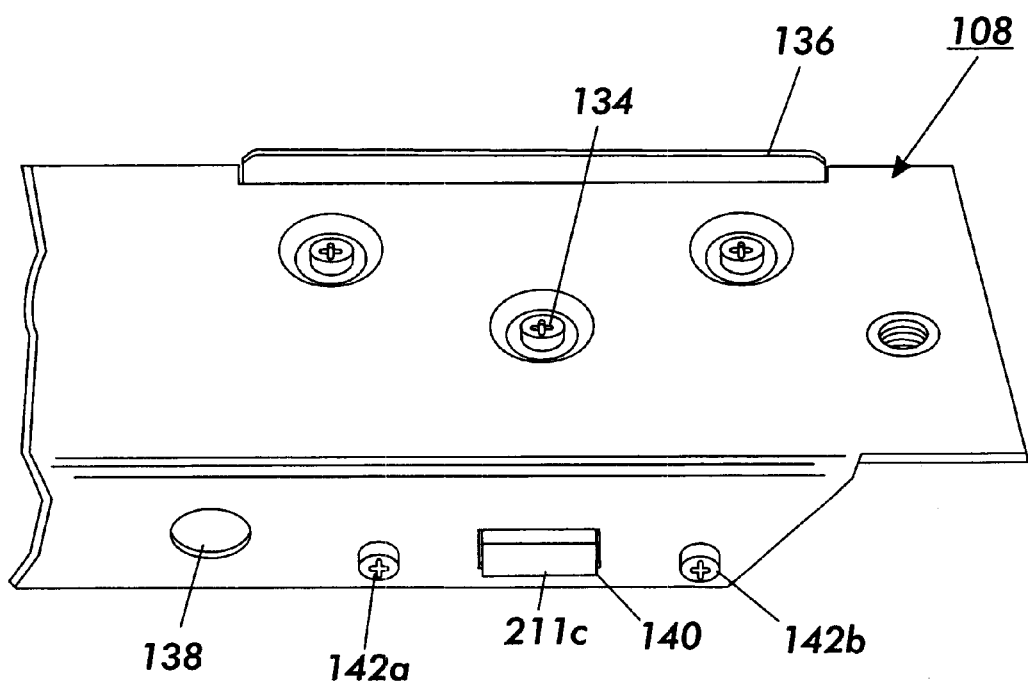
FIG. 12 is an enlarged perspective view of a portion of the bottom of a base of the application specific integrated circuit electrostatic voltmeter assembly of FIG. 2 with a modulator assembly according to a preferred embodiment of the present invention.
Figure 13:
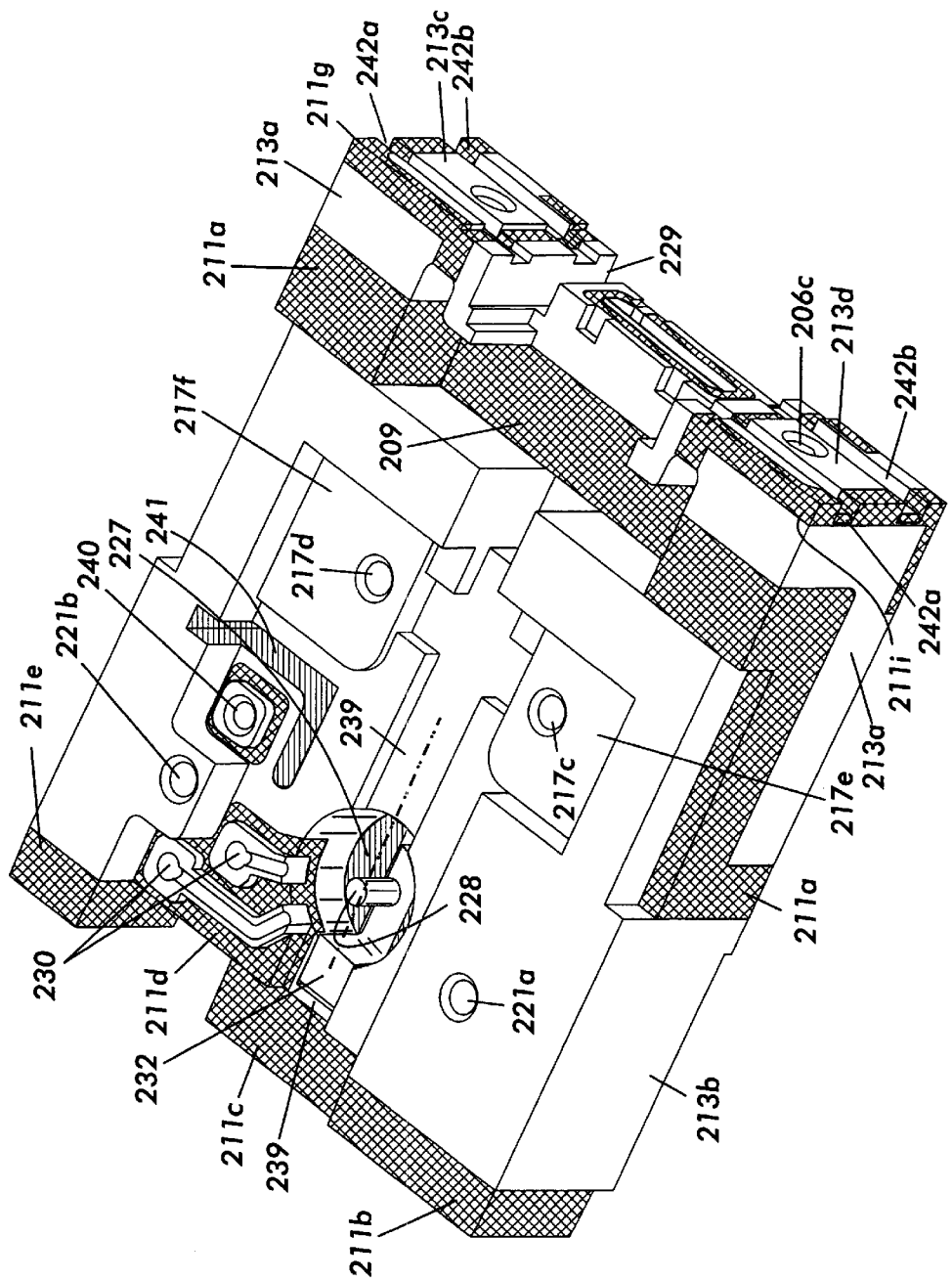
FIG. 13 is another enlarged perspective view of the top of the modulator assembly base depicted in FIG. 6 with a magnet and ferrite core of a magnetic driver according to a preferred embodiment of the present invention.

Heat sinking gaskets 128 (a–b) are provided on the insulating layer 106 as necessary or desirable to dissipate heat away from the board assembly 104. The base 108 has a cylindrical projection 130 for cooperation with a fastener 134, which extends through a hole 132 in the insulating layer 106. The projection 130 and the fastener 134 support the modulator assembly 200 on the base 108. An anti-static member 136, corresponding to the anti-static member 116 on the cover 102, is provided on the base 108 so as to be located behind the front plate 202 of the modulator assembly 200. The anti-static members 116 and 136 are composed of a suitable anti-static plastic material. Note FIG. 12, which shows the bottom of the base 108 with the modulator assembly 200. FIG. 12 is discussed in more detail below.

An air purge exit 138 is provided through a vertical wall of the base 108 for permitting air used to purge the modulator assembly 200 to exit as described in further detail below (note also FIG. 12). An alignment slot 140 is provided in the vertical wall of s the base 108 for positioning and aligning the modulator assembly 200 such that the modulator assembly 200 is accurately oriented with respect to the photoreceptor surface 14. Fasteners 142(a–b) attach the rear of the modulator assembly 200 to the vertical portion of the base 108. A mounting frame 144 is provided in the electrophotographic system 10 for mounting the electrostatic voltmeter assembly 100 in the electrophotographic system 10 so that the modulator assembly 200 is accurately situated and oriented with respect to the photoreceptor surface 14 (see FIG. 14).

Referring now to FIG. 3, the modulator assembly 200 has a front plate 202 which is attached to a modulator base 204 by fasteners 206 (a–b). The fasteners 206 (a–b) fit through holes 206 (c–d) located in the modulator base 204. Advantageously, the fasteners 206 (a–b) comprise screws with tapered heads and the holes 206 (c–d) in the modulator base 204 have corresponding counterpart cones so that when the screws are tightened in the holes the front plate 202 is centered with respect to a sensor electrode 210. Alternatively, the holes may be replaced by pins that fit snugly into holes in the front plate 202. The pins and the corresponding holes orient and align the front plate 202 and a sensing aperture 212 in the front plate 202 with respect to the sensor electrode 210. The front plate may be attached to the modulator base 204 by applying solder, for example, to the pins.

Figure 4:
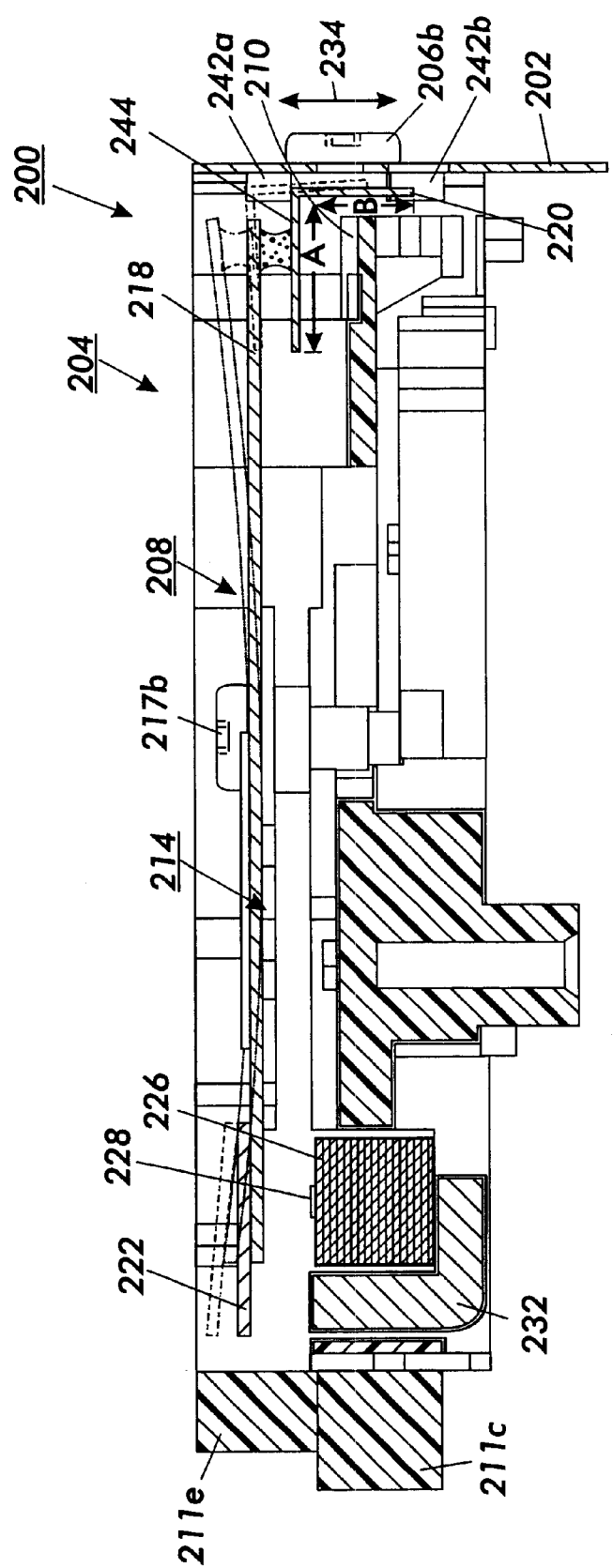
FIG. 4 is a full cross-sectional view of the modulator assembly taken along section line 4—4 in FIG. 3.

The assembly 200 includes a modulator 208 and a sensor electrode 210 (see also FIG. 4). The base 204 has insulating portions 211 (a–i), schematically illustrated by surface shading, and shielding areas 213 (a–d). See also FIGS. 6 to 10, 13, 15 and 16, which show different views of the modulator base 204 with the shielding areas and insulating portions.

Figure 6:
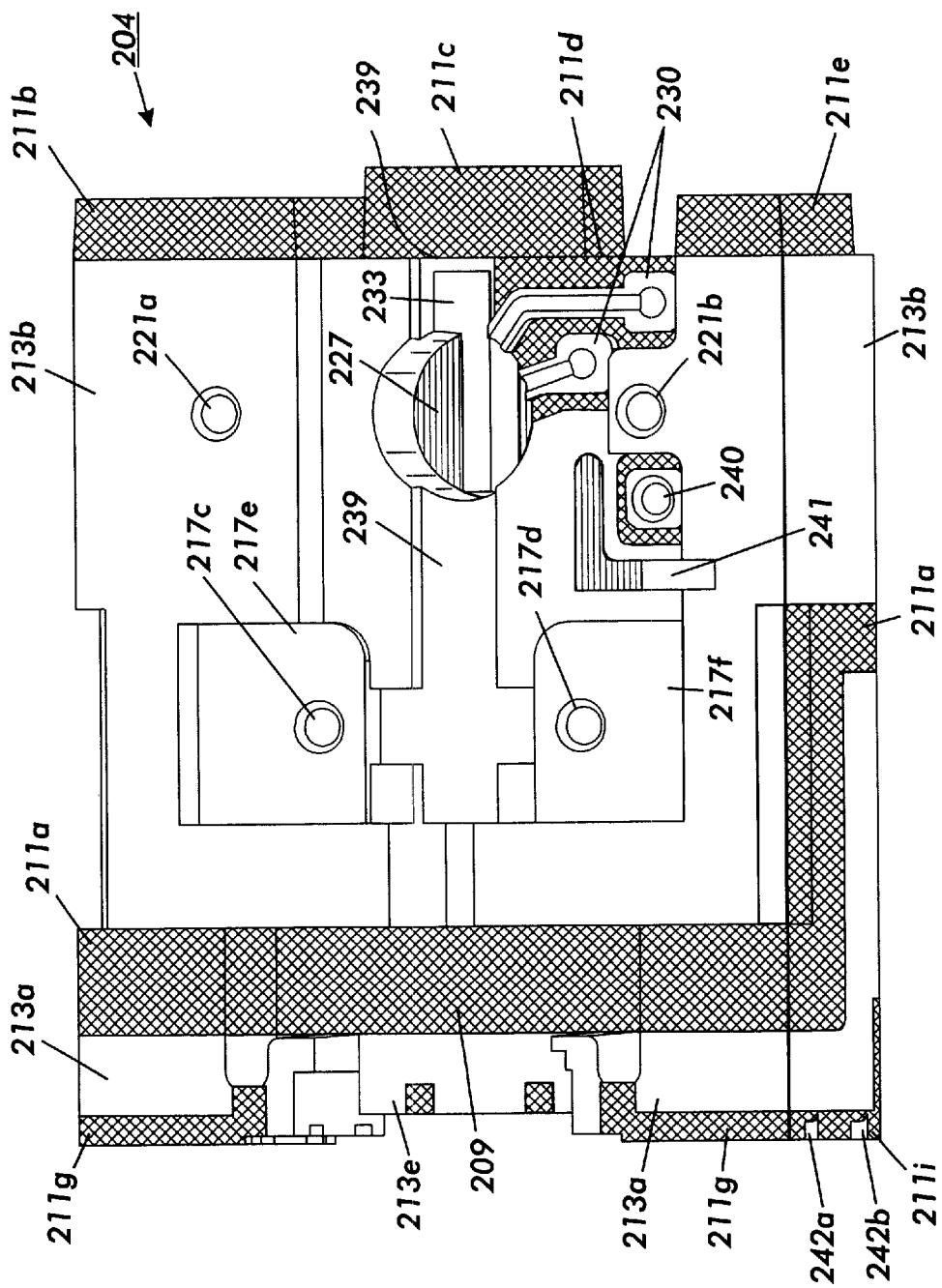
FIG. 6 is an enlarged perspective top view of a modulator assembly base according to a preferred embodiment of the present invention.

Referring now to FIG. 6, in a preferred embodiment of the present invention, the dimensions of the modulator base 204 are accurately controlled or defined so that orientation and alignment of the modulator assembly 200, and the front plate 202 attached to the modulator base 204, with respect to the photoreceptor surface 14 can be accurately controlled. In other words, by maintaining accurate dimensions for the modulator base 204, the positional relationship of the front plate 202 and a sensing aperture 212, which is provided in the front plate 202, with respect to the electrostatic field at the photoreceptor surface 14 can be accurately determined. According to a preferred embodiment of the present invention, the modulator base 204 is a precision molded plastic component, which is molded by a "two-shot" molding technology that allows isolated conductive/solderable areas and non-conductive areas to be accurately defined on a molded plastic base.

Figure 7:
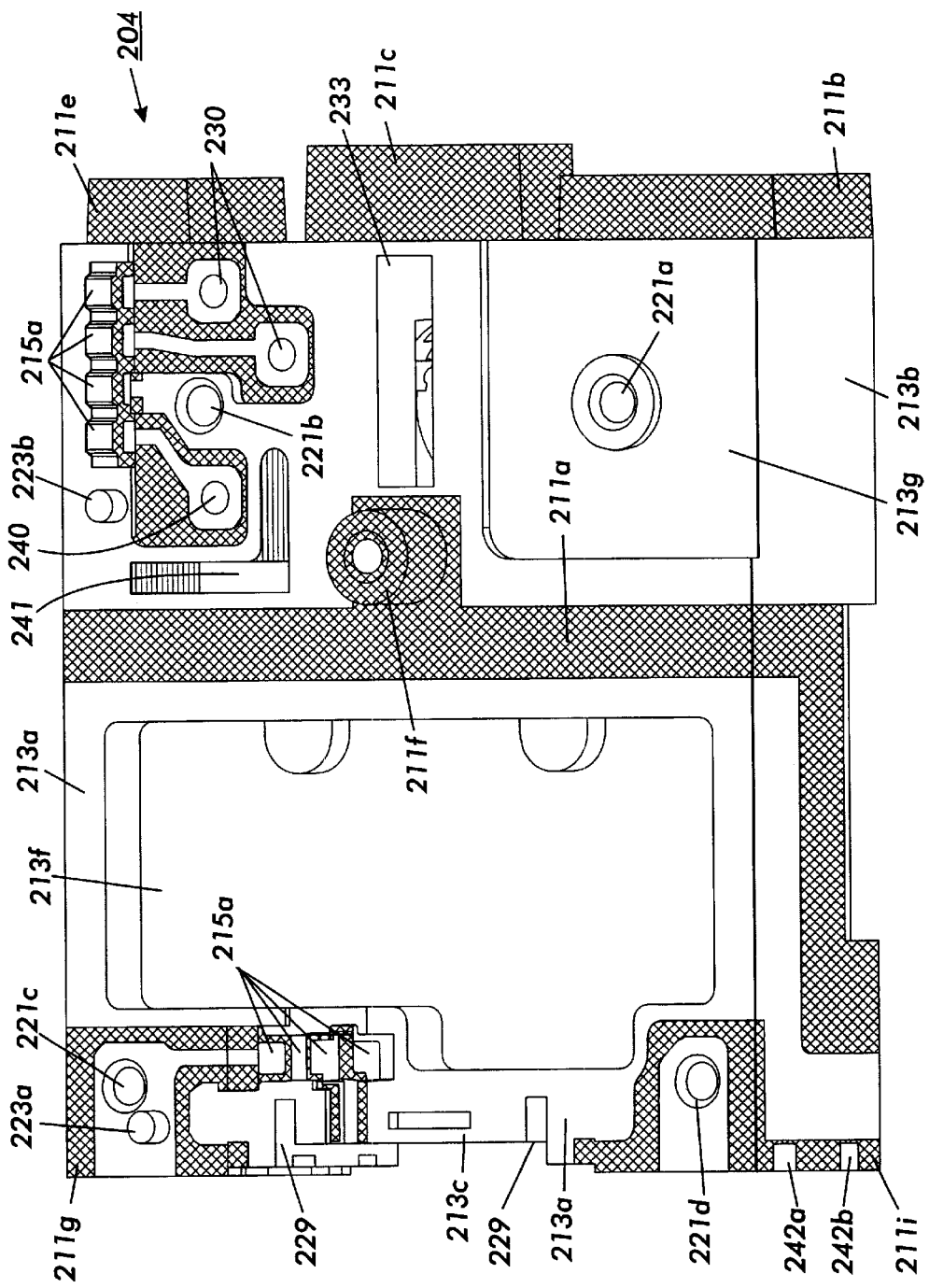
FIG. 7 is an enlarged perspective view of the bottom of the modulator assembly base depicted in FIG. 6.
Figure 8:
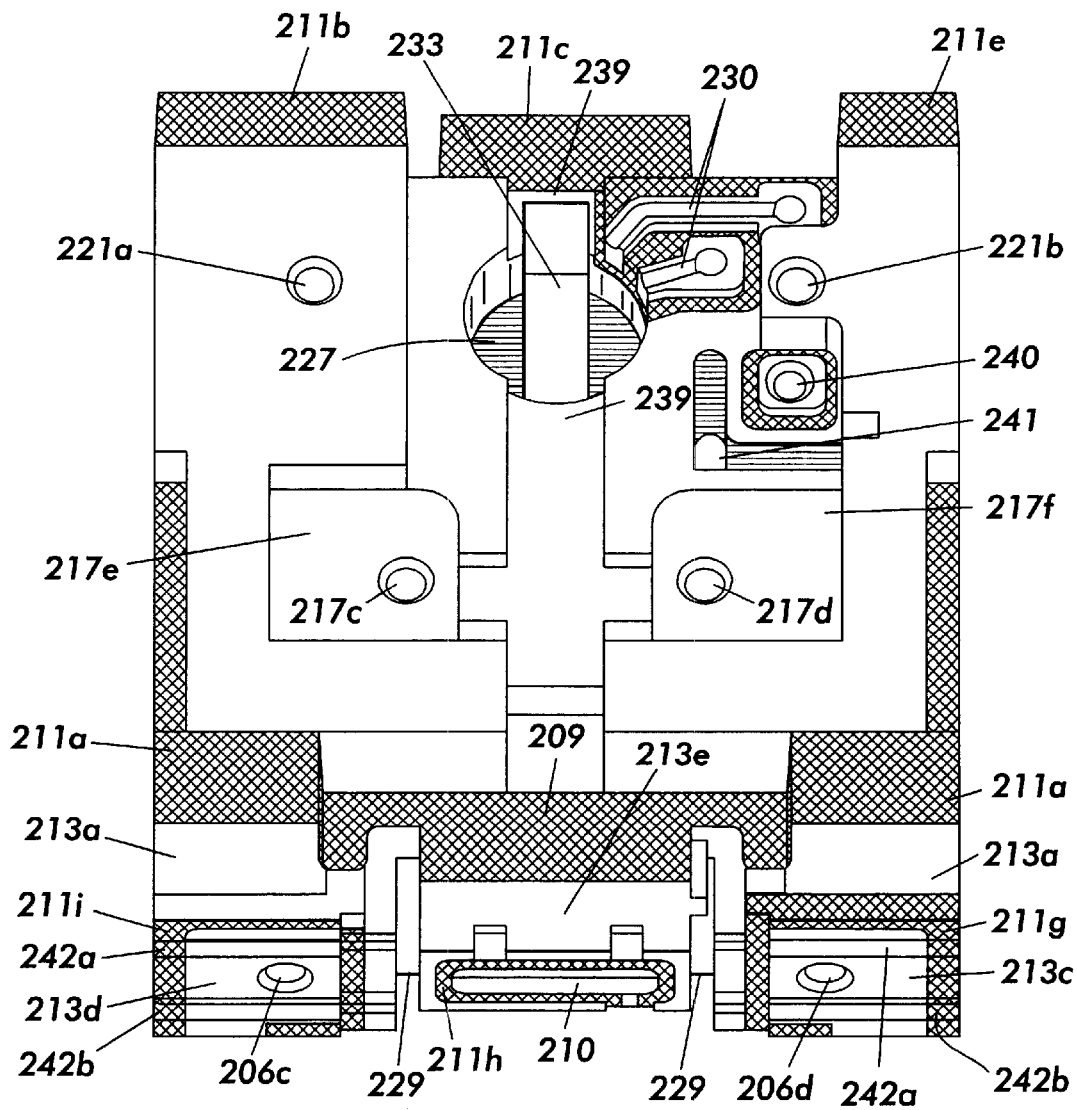
FIG. 8 is an enlarged perspective view of the front of the modulator assembly base shown in FIG. 6.
Figure 9:
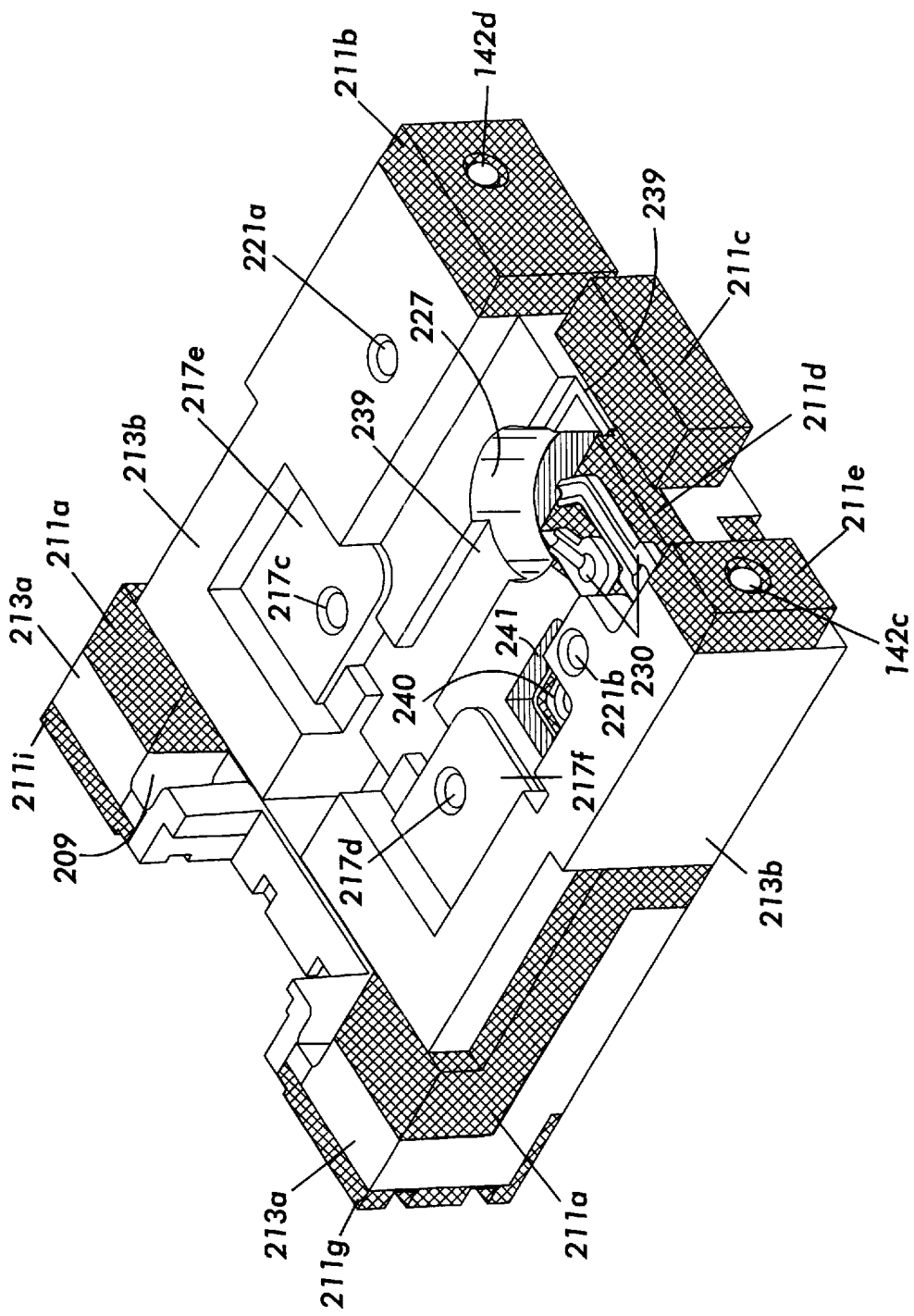
FIG. 9 is an enlarged perspective view of the rear of the modulator assembly base of FIG. 6.

Advantageously, the front shielding area 213a is a floating shield (see also FIGS. 7 and 8). The shielding area 213a extends from the top surface of the modulator base 204, via the sides and front of the modulator base 204, to the bottom surface (note FIGS. 6 through 10, 13, 15 and 16) for shielding the sensor electrode 210 and sensitive input circuits, such as MOS FETS, on the board assembly 104. The floating shielding area 213a includes a sensor electrode shield 213e. Advantageously, the shielding area 213a includes a cavity or recess 213f on the bottom of the modulator base 204 (note FIGS. 7 and 15) which provides shielding of the board assembly 104, in particular, the sensitive input circuits of the board assembly 104. In other words, the cavity 213f, in combination with shielding on the board assembly 104, provides effective and beneficial shielding of sensitive input circuitry.

The back shielding area 213b is a grounded shield (see FIGS. 6 through 9, 13, 15 and 16), which extends from the top surface of the modulator base 204, via the sides and back of the modulator base 204, to the bottom surface to provide a grounded drive area of the modulator base 204. The shielding area 213b includes a recess or cavity 213g on the bottom of the modulator base 204 (note FIGS. 7 and 15) which provides shielding of drive circuitry and cable traces on the board assembly 104 that is positioned underneath the modulator base 204 when the electrostatic voltmeter assembly 100 is assembled (note FIG. 2). An air gap 209 is provided between the floating shielding area 213a and the grounded shielding area 213b (see FIGS. 6, 8, 9, 13 and 16) having a size sufficient to minimize coupling between the floating and grounded circuits. Furthermore, the insulating portion 211a (see FIGS. 6 through 9, 13, 15 and 16), which extends from the top surface of the modulator base 204, via the sides of the modulator base 204, to the bottom surface provides insulation between the floating sense area 213a and the grounded drive area 213b. The insulating areas 211b and 211e (note again FIGS. 6 through 9, 13, 15 and 16) serve as reference mounting surfaces with respect to the electrostatic voltmeter assembly base 108 (see FIG. 2). In other words, the end surfaces of the insulating areas 211b and 211e abut the vertical portion of the base 108 (note FIG. 2) and the modulator assembly 200 is fixed thereto by fasteners 142 (a–b) which fit into holes 142(c–d) located in the modulator base 204 (note FIGS. 9, 11 and 12).

Figure 14:
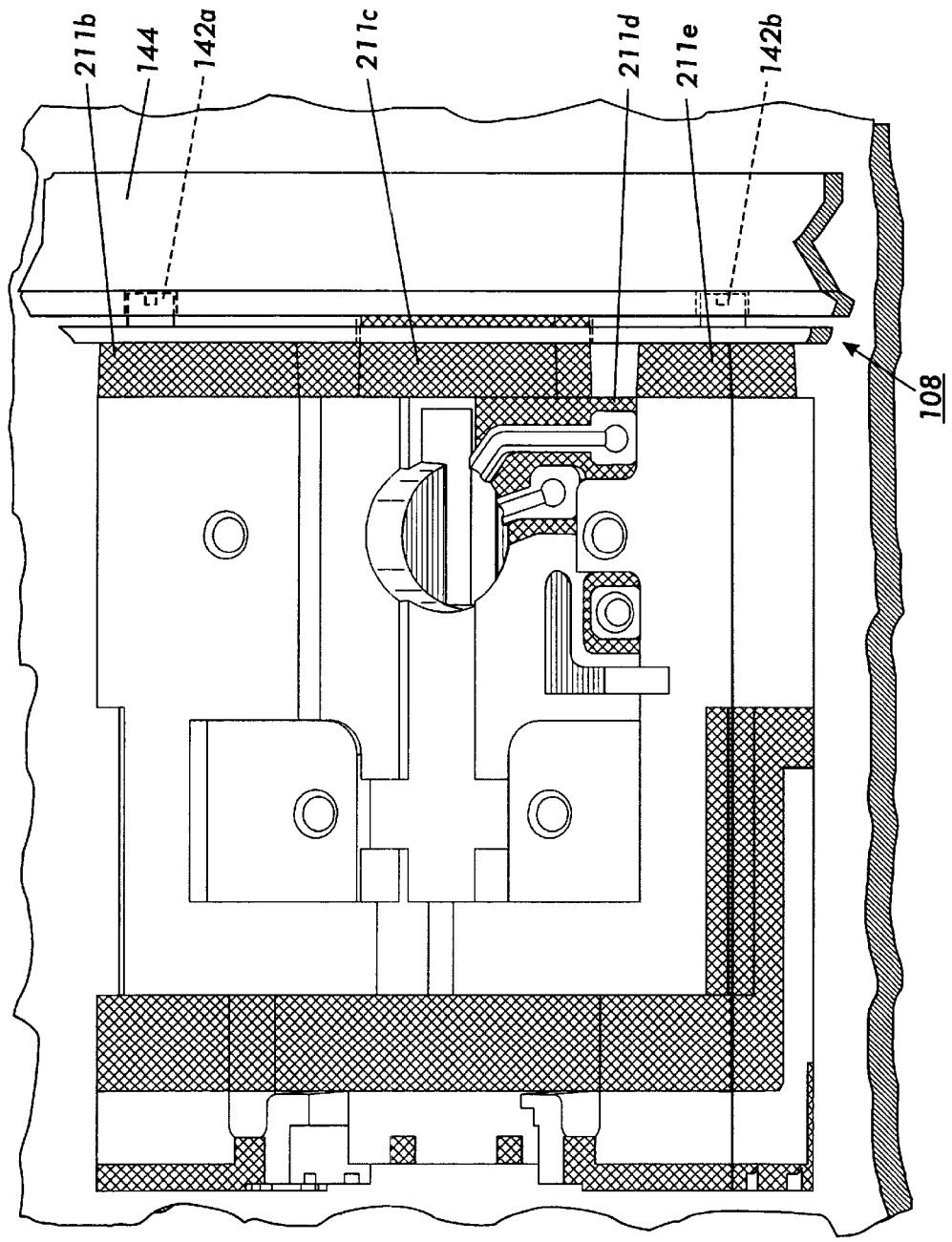
FIG. 14 is another enlarged perspective view of the top of the modulator assembly base depicted in FIG. 6 with a mounting frame for mounting the modulator assembly in a electrophotographic apparatus according to a preferred embodiment of the present invention.
Figure 15:
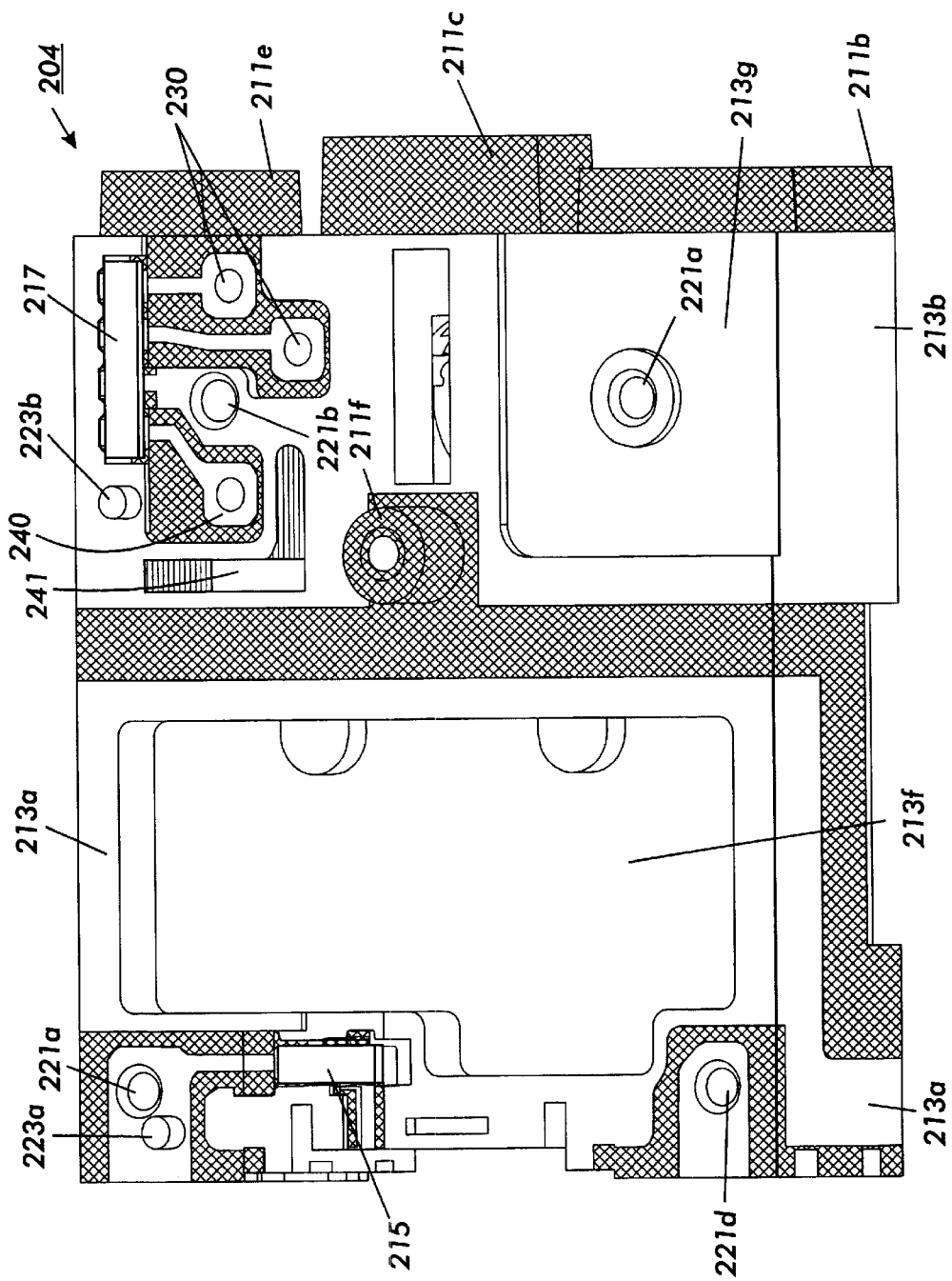
FIG. 15 is another enlarged perspective view of the bottom of the modulator assembly base depicted in FIG. 6 With connecting strips for electrically connecting the modulator assembly with a printed wire board assembly.
Figure 16:
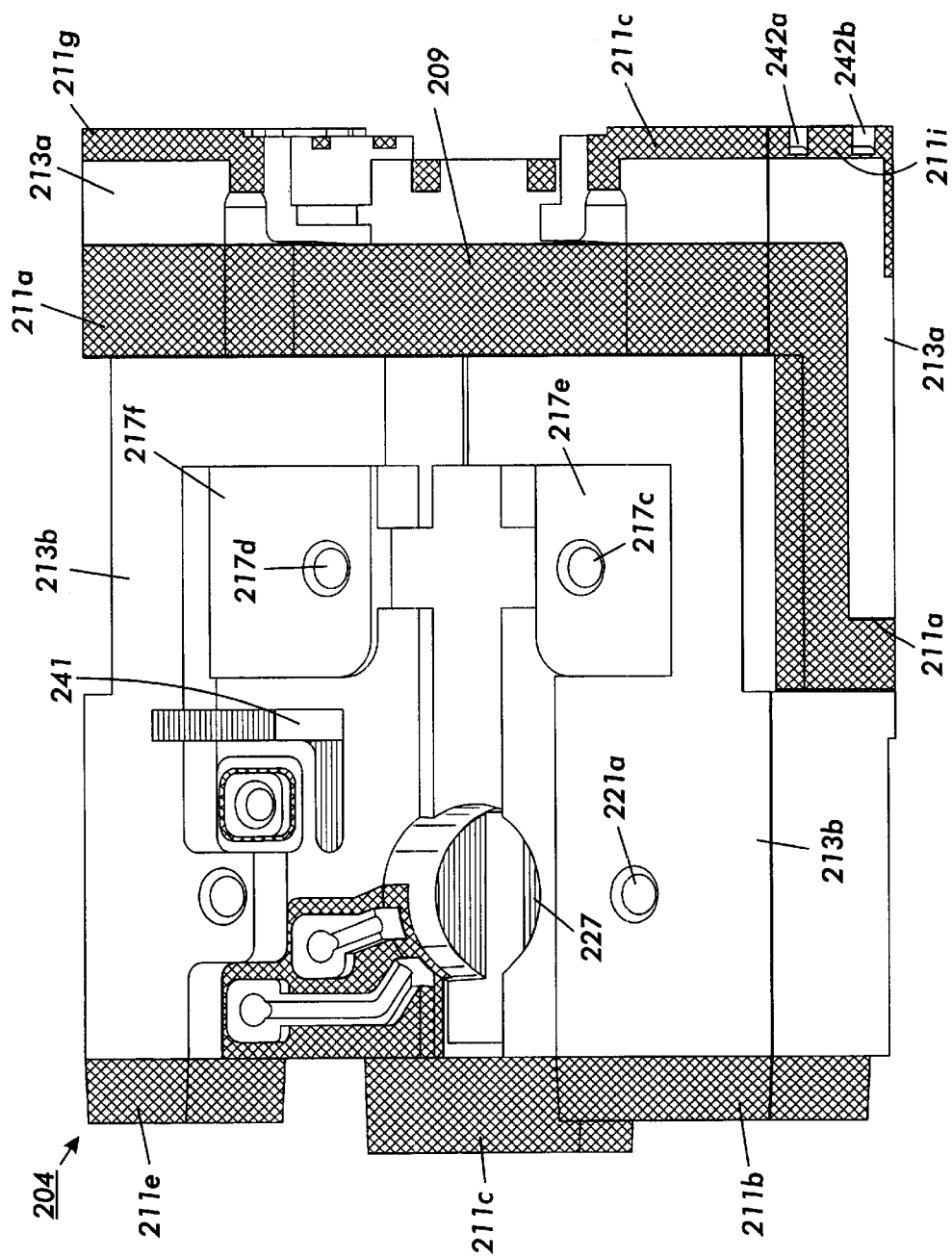
FIG. 16 is another enlarged perspective view of the top of the modulator assembly base depicted in FIG. 6 viewed from a different orientation.

The rear end of the insulating area 211c (see FIGS. 6 through 9 and 11 through 16) is a reference surface for calibration and mounting/installation of the modulator assembly 200. In this, the end of the insulating area 211c is positioned at the alignment slot 140 in the vertical wall of the base 108 (note FIGS. 2 and 12) and abuts against the mounting frame 144 (note FIG. 14) so that the sensing aperture 212 in the front plate 202 and the sensor electrode 210 are accurately positioned with respect to the photoreceptor surface 14. FIG. 14 is a schematic depiction of the modulator base 204 and the mounting frame 144, which is supported by an electrostatic voltmeter support plate, with other parts of the electrostatic voltmeter assembly 100 removed for purposes of clarity. In other words, by maintaining with precision the dimensions and position of the mounting frame 144 and the insulating area 211c, when the insulating area 211c abuts against the mounting frame 144 through the alignment slot 140 the position and orientation of the front of the modulator assembly 200 in relation to the photoreceptor surface 14 can be accurately determined. Accordingly, the reference surface provided by the end of the insulating area 211c facilitates calibration and mounting/installation of the modulator assembly 200.

The insulating areas 211g and 211i, at opposite ends of the front end of the modulator base 204 (see FIGS. 6 through 10, 13 and 16), provide insulation between the sensor electrode shield 213e and the front plate 202 of the modulator assembly 200.

Figure 11:
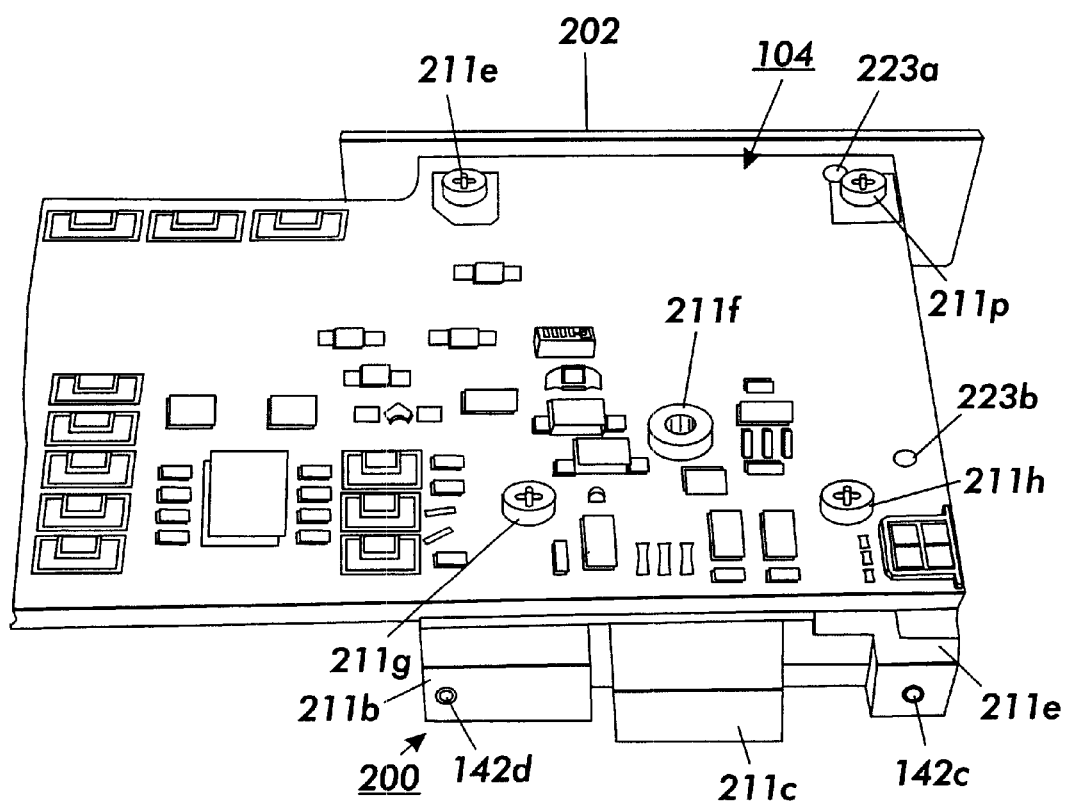
FIG. 11 is an enlarged perspective view of a portion of the bottom of a printed wire board assembly of the application specific integrated circuit electrostatic voltmeter assembly shown in FIG. 2 with a modulator assembly according to a preferred embodiment of the present invention.

Referring to FIG. 7, the modulator base 204 has holes 221 (a–d) provided therein for mounting the modulator assembly 200 on the board assembly 104 with suitable fasteners 221 (e–h) (see FIG. 11). Projections 223 (a–b) are located on the bottom surface of the modulator base 204, along one edge thereof, for aligning the modulator assembly 200 on the board assembly 104 (see also FIG. 11). In this, the projections 223 (a–b) fit into corresponding holes in the board assembly 104 and thereby accurately align and position the modulator assembly 200 on the board assembly 104. Furthermore, the projections 223 (a–b) simplify assembly of the modulator assembly 200 on the board assembly 104 because the modulator assembly 200 is properly situated and retained on the board assembly 104 by the projections 223 (a–b) fitting into corresponding holes in the board assembly 104 while the fasteners 221 (c–h) are easily fit into the holes 221 (a–d).

A cylindrical projection 211f (note FIG. 7) is provided on the bottom surface of the modulator base 204, integrally formed with the insulating portion 211a, for further alignment and mounting of the modulator assembly 200 on the base 108 of the electrostatic voltmeter assembly 100. In this, in addition to the reference mounting surfaces provided by the end surfaces of the insulating areas 211b and 211e, the cylindrical projection 130 on the base 108 (see FIG. 2) cooperates with the projection 211f on the bottom surface of the modulator base 204 to align and position the modulator assembly 200 in relation to the electrostatic voltmeter assembly base 108. See also FIG. 11 showing the projection 211f of the modulator base 204 extending through a hole in the board assembly 104.

The sensor electrode 210 may be any commonly known sensor element suitable for capacitance coupling with an electrostatic field external to the base 204. In this, a sensing aperture 212 is provided in the front plate 202 of the base 204 for permitting the sensing capacitance coupling (note FIG. 3). The sensing aperture 212 is disposed at a position that is proximate to the position of the sensor electrode 210. The sensor electrode 210 produces a signal which corresponds to the magnitude of the external electrostatic field for transmission, via a conducting strip 215 (see FIG. 15), to an external voltmeter (not shown). FIG. 7 shows metallic pads 215a for connecting the sensor electrode 210 with the conducting strip 215. The conducting strip 215 may be a Fujipoly "Zebra Strip" type connector.

Referring again to FIG. 3, the modulator 208 includes a vibratory beam 214 having mounting supports 216 (a–b) at a midpoint of the beam 214 for securely mounting the beam 214 within the base 204 with fasteners 217 (a–b) which fit into holes 217 (c–d) provided in the modulator base 204 (note FIGS. 6, 8, 9, 13 and 16). Advantageously, the beam mounting holes 217 (a–d) are situated in planar surfaces 217 (e–f), which are configured as raised planar surfaces on the modulator base 204 to provide reference mounting surfaces for mounting the beam 214 within the modulator base 204. In other words, the upper planar surfaces of the beam mounting surfaces 217 (e–f) are accurately configured so that when the beam 214 is mounted on the mounting surfaces 217 (e–f), by the beam mounting fasteners 217 (a–b) being fit into the beam mounting holes 217 (c–d), the beam 214 is accurately positioned with respect to the sensor electrode 210 and a magnetic driver 226.

The vibrating beam 214 includes a longitudinal arm element 218 and connecting or web portions 219 (a–b), which are between the arm element 218 and the mounting supports 216 (a–b) and connect the mounting supports 216(a–b) to the arm element 218. The arm element 218 has a device for interrupting the electrostatic voltage or chopper 220 at one end of the arm element 218 and a counterweight strip or slug 222 of a magnetically susceptible material, such as iron, which will close the magnetic path (hereinafter simply "counterweight"), at the other end. A carbon fiber wire 224 is provided for electrically connecting the chopper 220 with the front floating shielding area 213a.

A magnetic coil 226, which is located in a coil cavity 227 (note FIGS. 6, 8, 9, 13 and 16), and a permanent magnet 228 (note again FIG. 13) are located under the vibratory beam 214 at an end of the arm element 218 carrying the counterweight 222. Reference surfaces 239 (a–b) are provided at opposite ends of the coil cavity 227 for providing a guide for positioning the magnet 228 and a ferrite core 232 in relation to the vibratory beam arm 218. In this, since the gaps between the top of the magnet 228 and the arm element 218 and the pole piece of the ferrite core 232 and the arm element 218 must be accurate, by placing a surrogate for the arm element 218 on the reference surfaces 239 (a–b) to bridge the coil cavity 227 (as shown by phantom lines in FIG. 13) the top positions of the magnet 228 and the ferrite core 232 can be adjusted in relation to the surrogate beam thereby ensuring that there will be an accurate gap between the magnet 228, the ferrite core 232 and the arm element 218 when the vibratory beam 214 is mounted in the modulator base 204. In other words, the configuration and dimensions of the reference surfaces 239 (a–b) are accurately defined in relation to the desired top positions of the magnet 228 and the ferrite core 232 so that the desired gaps between the magnet 228 and the arm element 218 and the pole piece of the ferrite core 232 and the arm element 218 are obtained when the modulator 200 is assembled.

Coil connections 230 extend from the magnetic coil 226 to the bottom of the modulator base 204 (see FIGS. 7 and 15) to connect the magnetic coil 226 with a connecting strip 217 (note FIG. 15) by means of metallic connecting pads 215a (note again FIG. 7). The magnetic coil 226 operates as a magnetic driver to drive the vibratory beam 214 to oscillate by the magnetic force applied to the counterweight 222 via the magnetic path from the magnet 228 to the counterweight 222 and through a ferrite core 232 returning to the magnet 228. A slot or cavity 233 is provided in the modulator base 204 for retaining the ferrite core 232 (note FIGS. 6 through 8, 13, 15 and 16). In this, vibratory motion is generated in the arm element 218 and the web portions 219 (a–b) of the vibratory beam 214, with the vibratory motion of the web portions 219 (a–b) increasing toward the center of the vibratory beam 214, whereas vibratory motion is not produced in the mounting supports 216 (a–b) of the vibratory beam 214, which are firmly attached to the modulator base 204 by the fasteners 217 (a–b). The counterweight 222 balances the chopper 220 at the other end of the arm element 218 and is located on the arm 218 so as to maximize the magnetic flux of the ferrite core 232. When the arm element 218 is induced to vibrate by the magnetic coil 226, the chopper 220 oscillates in the directions indicated by arrows 234 in FIG. 3 and 4. During the oscillation, the sensor electrode 210 repeatedly couples and decouples to an external electrostatic field as the chopper 220 passes the sensing aperture 212 in the front plate 202. Specifically, when the arm element 218 is vibrated or oscillated by influence of the magnetic flux of the ferrite core 232, the oscillation that results causes the chopper 220 to vibrate up and down across the sensing aperture 212 causing the sensor electrode 210 to couple and decouple with an external electrostatic field on a photoreceptor belt 14 through the sensing aperture 212.

Accordingly, oscillation of the arm element 218 results from the force applied by the magnetic coil 226, which functions as a magnetic driver for the vibratory element 208. A feedback crystal or piezoelectric pickup 236, advantageously located at one of the web portions 219 (a–b) of the beam 214 (see FIG. 3), senses the vibrations and generates feedback signals to a feedback control circuit (not shown). In this, the drive signals supplied to the magnetic coil 226 are regulated and the frequency and mode of the vibrations of the arm element 218 can be controlled. The feedback signals of the feedback crystal 236 are outputted via a Litz wire connection 238 soldered at 240 (note again FIG. 3), from where the feedback signals are fed to connecting pads 215a at the bottom of the modulator base 204 (see FIG. 7) for connection with the connecting strip 217 (note FIG. 15), such as a Fujipoly "Zebra Strip" type connector. An "L" shaped cut or gap 241 (note FIGS. 6 through 9, 13, 15 and 16) extending through the modulator base 204 is provided adjacent to the feed-through 240 for shielding the feed-through wires connecting with the connecting strip 217, in particular, for shielding the feed-through 240 for the Litz wire connection 238.

Figure 10:
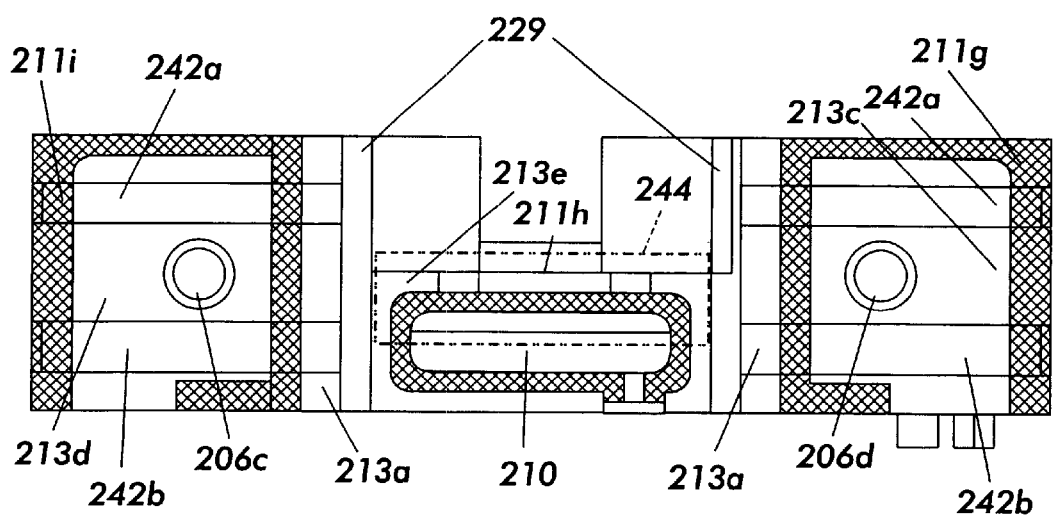
FIG. 10 is another enlarged perspective view of the front of the modulator assembly base illustrated in FIG. 6.

As previously described, the chopper 220 vibrates up and down across the sensing aperture 212. It is important that the lower edge of the chopper 220 be essentially centered over the sensor electrode 210 at the chopper's rest position (see phantom lines in FIG. 10 depicting the position of the chopper 220). This positional relationship between the chopper 220 and the sensor electrode 210 is achieved by assembling the vibratory beam 214 using a beam assembly fixture. This essentially mimics or duplicates the accurately controlled configuration of the modulator base 204. In particular, the various reference mounting surfaces for the vibratory beam 214, so that after the vibratory beam 214 has been assembled using the beam assembly fixture the beam 214 can be mounted in the modulator base 204. The various members of the vibratory beam 214, such as the chopper 220 and the arm element 218, will be oriented and aligned with respect to their corresponding elements in the desired manner. In this, it is the configuration and built in design features of the modulator base 204 which allow the easy and accurate assembly of the vibratory beam 214 and its subsequent mounting in the modulator base 204.

The chopper 220 is attached to the beam arm element 218 by a fillet of ultraviolet "UV" epoxy between the chopper 220 and the arm element 218, as schematically depicted in FIG. 4.

Air purge grooves 242 (a–b) (note FIG. 10) are provided across the front of the base 204 to enable air flow to be delivered across the sensor electrode 210. This air flow is operably provided around the sensing aperture 212 and the sensor electrode 210 for purging toner particles and other contaminants from the modulator 208 and sensor electrode 210. In accordance with the subject invention, a vane or plate element 244 is connected to the arm element 218 adjacent to the chopper 220 to enhance the purging effect of the air flow through the grooves 242 (a–b). In a preferred embodiment, the vane 244 is formed by extending the chopper 220 backward so as to form an integral vane 244, which is generally horizontal relative to the vertically disposed chopper 220 forming an "L" shaped configuration with the chopper 220. The rapid vibration of the arm element 218 and the vane 244 stirs up the air passing through channels 242a and 242b and past the chopper 220 such that the modulator 208 and sensor electrode 210 are self-purged of debris by reciprocal movement of the vane 244 when the arm element 218 oscillates.

FIG. 5 shows the inner surface of the cover 102 showing the air purge path by arrows 300. An air inlet 302 is provided for air from a hose or pipe (not shown), for example, to be delivered to channels 304 in the cover 102. The channels 304 direct air along an air path so as to pass via the air purge grooves 242a and 242b of the modulator base 204 across the sensing aperture 212 and in front of the sensor electrode 210. Air flows from the air purge exit 138 in the electrostatic voltmeter assembly base 108 (shown in FIGS. 2 and 12). The baffle 126 is provided to guide the air to the air purge exit 138.

It has been determined that as the vane 244 oscillate up and down at high frequency, the motion of the vane 244 produces an advantageous turbulence or air current in the vicinity of the modulator 208 and the sensor electrode 210 which enhances the purging of toner particles and other contaminants from the modulator assembly 200. The self-enhanced turbulence generated by oscillation of the vane 244 enhances and improves the purging effect of the passing air from the purging grooves 242 (a–b) thereby eliminating or minimizing drift errors in the electrophotographic process. By extending the chopper 220 that is attached to the vibrating arm element 218 to form the vane 244 removal of toner and other contaminants from the electrostatic voltmeter is improved.

Although, the location of the vane 244 on the arm element 218 may be at any location, which provides the above advantageous air turbulence or currents, it has been found that by locating the vane 244 at a terminal end of the arm element 218 such that it abuts the chopper 220, or, in a preferred embodiment, is integrated with the chopper 220, provides further advantageous results. In this, a location of the vane 244 at the end of the arm element 218 provides a further beneficial electrostatic shielding effect for the sensor electrode 210. More specifically, positioning the vane 244 directly above the sensor electrode 210 shields the sensor electrode 210 from signals generated by the motion of the arm element 218, which would otherwise tend to cause error in the sensing by the sensor electrode 210.

After reading and understanding the foregoing description of a preferred embodiment of the invention, in conjunction with the illustrative drawings, it will be appreciated that several distinct advantages of the subject modulator base for a modulator assembly of an electrostatic voltmeter are obtained.

A preferred embodiment of the invention has a modulator assembly with a modulator base which is a precision molded plastic part enabling high manufacturing yield in the electrostatic voltmeter probe assembly. The dimensions and resistivity of the materials used in the modulator base are tightly and carefully specified and controlled on each surface part of the modulator base with a view to providing an electrostatic voltmeter assembly having low assembly costs and well controlled mechanical and electronic parameters. The modulator base of the present invention provides accurate and carefully controlled tooling and assembly of the modulator probe assembly.

Specifically, the present invention simplifies assembly of the application specific integrated circuit electrostatic voltmeter by making the modulator assembly self-aligning through various reference mounting surfaces provided on the modulator base. Advantageously, the modulator base of the present invention eliminates all soldered or wired connections from the modulator assembly to the printed wire board assembly.

The modulator base of the invention improves performance of the modulator assembly by maximizing signal to noise through advantageous shielding of the sensor electrode and other components from errant noise. The invention maximizes the sensing area in accordance with the desired resolution of the electrostatic signals. The modulator assembly of the present invention optimizes the tradeoffs inherent in the physical size, increased motion and higher frequency of a high performance electrostatic voltmeter. In this, by accurately configuring the dimensions and size of the modulator assembly, and with accurate and careful tooling and assembly of the modulator assembly, the performance and functionality of the modulator assembly is optimized. Furthermore, the present invention provides increased speed of response through higher modulation resulting from maximization of signal to noise. Interchangeability of the vibratory beam is possible due to the accurate and standardized dimensions and configuration of the modulator base, i.e., various vibratory beams can be substituted without changing the modulator base.

High performance shielding of the very high impedance sensor electrode input and FET gate is provided as a result of the printed wire board assembly lay out and the design of the modulator base. The drive voltage on the magnetic coil drive is shielded from the high impedance FET input. Moreover, the capacitance coupling between the floating input sensor circuitry and the circuit common/ground is minimized.

The modulator base of the present invention provides improved air purging of the modulator assembly by air purge paths which deliver enhanced air flow across the front of the modulator assembly so as to keep out contaminant, control the air flow, and provide an exit to sweep out contaminants that do get in. The present invention eliminates need for a separate air line connector into the application specific integrated circuit electrostatic voltmeter.

The modulator base of the invention provides a mounting system that enables simple and accurate orientation and alignment of the sensor electrode surface with the photoreceptor surface. Moreover, the present invention provides an integrated electrostatic voltmeter having the modulator and electronic components in the same assembly.

In describing the invention, reference has been made to preferred embodiments and illustrative advantages of the invention. Those skilled in the art, however, and familiar with the instant disclosure of the subject invention, may recognize additions, deletions, modifications, substitutions and other changes that fall within the purview of the subject invention.

What is claimed is:
1. An electrostatic voltmeter having a modulator assembly for modulating and sensing an electrical field of an electrophotographic system, the electrostatic voltmeter comprising:
   a modulator base of the modulator assembly for mounting said modulator assembly in the electrostatic voltmeter;

a vibratory beam disposed in said base for modulating an electrical field by oscillating when a vibratory magnetic force is applied at one end of said beam;

a sensor electrode for sensing an electrical field modulated by said vibratory beam; and at least one reference mounting surface precision molded as part of said modulator base for orienting and aligning said modulator assembly with respect to an electrical field of the electrophotographic system.

2. An electrostatic voltmeter having a modulator assembly as defined in claim 1, wherein:

said at least one reference mounting surface includes a first projection at one end of said modulator base for abutting against a mounting frame of the electrophotographic system, whereby an opposite end of said modulator base is located at a predetermined position with respect to the electrical field.

3. An electrostatic voltmeter having a modulator assembly as defined in claim 2, further comprising:

a chopper at one end of said beam;

said chopper and sensor electrode being situated at the opposite end of said modulator base located at said predetermined position.

4. An electrostatic voltmeter having a modulator assembly as defined in claim 2, further comprising:

a base of the electrostatic voltmeter;

said at least one reference mounting surface includes a second projection and a third projection at said one end of the modulator base;

said second and third projection abutting against said base of the electrostatic voltmeter for positioning the modulator assembly in the electrostatic voltmeter.

5. An electrostatic voltmeter having a modulator assembly as defined in claim 1, further comprising:

at least one air purge groove fashioned into a front end of said modulator base.

6. An electrostatic voltmeter having a modulator assembly as defined in claim 5, wherein:

said at least one air purge groove comprises a pair of parallel air purge grooves.

7. An electrostatic voltmeter having a modulator assembly as defined in claim 1, further comprising:

a magnetic drive in said modulator base for applying a magnetic force to one end of said vibratory beam and said magnetic drive including a magnet and a core;

a pair of beam mounting surfaces in said modulator base for positioning said beam at a predetermined orientation with respect to said sensor electrode and said magnet and core of said magnetic drive.

8. An electrostatic voltmeter having a modulator assembly as defined in claim 7, further comprising:

magnet reference surfaces in said modulator base at opposite sides of said magnetic drive; said magnet reference surfaces lying in the same plane;

said magnet and said core being positioned in said modulator base such that a top end of said magnet and a pole of said core, proximate to said vibratory beam, lie in the same plane as said magnet reference surfaces.

9. An electrostatic voltmeter having a modulator assembly as defined in claim 1, further comprising:

at least two shielding areas of said modulator base;

a first shielding area comprising a floating shield for electrically shielding said sensor electrode; and a second shielding area comprising a grounded shield for electrically shielding a magnetic drive area of said modulator base.

10. An electrostatic voltmeter having a modulator assembly as defined in claim 9, wherein:

said first shielding area includes slots adjacent opposite ends of said sensor electrode;

said floating shield extending in said slots to electrically shield said sensor electrode; and a recess on a bottom surface of said modulator base, said floating shield extending in said recess for shielding input circuitry of the electrostatic voltmeter.

11. An electrostatic voltmeter having a modulator assembly as defined in claim 1, further comprising:

alignment projections on a bottom surface of said modulator base; and said projections aligning and retaining said modulator assembly in the electrostatic voltmeter for mounting thereto.

* * * * *